(12) United States Patent
Takagiwa

(10) Patent No.: US 11,527,693 B2
(45) Date of Patent: Dec. 13, 2022

(54) THERMOELECTRIC MATERIAL, METHOD FOR PRODUCING (MANUFACTURING) SAME AND THERMOELECTRIC POWER GENERATION MODULE USING SAME

(71) Applicant: National Institute for Materials Science, Ibaraki (JP)

(72) Inventor: Yoshiki Takagiwa, Ibaraki (JP)

(73) Assignee: National Institute for Materials Science, Tsukuba (JP)

( * ) Notice: Subject to any disclaimer, the term of this patent is extended or adjusted under 35 U.S.C. 154(b) by 324 days.

(21) Appl. No.: 16/642,878

(22) PCT Filed: Aug. 29, 2018

(86) PCT No.: PCT/JP2018/032031
§ 371 (c)(1),
(2) Date: Feb. 27, 2020

(87) PCT Pub. No.: WO2019/044931
PCT Pub. Date: Mar. 7, 2019

(65) Prior Publication Data
US 2020/0365791 A1    Nov. 19, 2020

(30) Foreign Application Priority Data

Aug. 31, 2017 (JP) .............................. JP2017-166286
Nov. 6, 2017 (JP) .............................. JP2017-213401

(51) Int. Cl.
*H01L 35/20* (2006.01)
*B22F 3/10* (2006.01)
(Continued)

(52) U.S. Cl.
CPC ............... *H01L 35/20* (2013.01); *B22F 3/10* (2013.01); *C22C 1/05* (2013.01); *C22C 38/02* (2013.01);
(Continued)

(58) Field of Classification Search
CPC . H01L 35/20; H01L 35/34; B22F 3/10; C22C 1/05; C22C 38/02; C22C 38/06
See application file for complete search history.

(56) References Cited

FOREIGN PATENT DOCUMENTS

| JP | 2000-323759 A | 11/2000 |
| JP | 2006-100346 A | 4/2006 |

OTHER PUBLICATIONS

Shohda, Masahiro, et al. "Seebeck effect of Fe—Al—Si Alloy and Low temperature Thermoelectric Properties", Tetsu-to-Hagané, vol. 84, No. 2, pp. 154-158. (Year: 1998).*
(Continued)

*Primary Examiner* — Tamir Ayad
(74) *Attorney, Agent, or Firm* — Trojan Law Offices

(57) ABSTRACT

Provided is a thermoelectric material having an intermetallic compound in an Al—Fe—Si system as a main component, exhibiting a thermoelectric effect in a temperature range from a room temperature to 600° C., and becoming a p-type or n-type thermoelectric material by a composition control, a manufacturing method thereof, and a thermoelectric power generation module thereof. A thermoelectric material according to the present invention including at least Al, Fe, and Si and represented by a general formula of $Al_{12+p-q}Fe_{38.5+3q}Si_{49.5-p-2q}$ (where p satisfies $0 \leq p \leq 16.5$ and q satisfies $-0.34 \leq q \leq 0.34$) and including a phase represented by $Al_2Fe_3Si_3$ as a main phase.

19 Claims, 7 Drawing Sheets

(51) Int. Cl.
*C22C 38/02* (2006.01)
*C22C 38/06* (2006.01)
*H01L 35/34* (2006.01)
*C22C 1/05* (2006.01)
*H02N 11/00* (2006.01)

(52) U.S. Cl.
CPC .............. *C22C 38/06* (2013.01); *H01L 35/34* (2013.01); *H02N 11/00* (2013.01)

(56) References Cited

OTHER PUBLICATIONS

Martin C J Marker et al: "Phase equilibria and structural investigations in the system AlFeSi" Intermetallics, Elsevier Science Publishers B.V, GB, English vol. 19, No. 12, May 2, 2011 (May 2, 2011), pp. 1919-1929, XP028307328, ISSN: Text 0966-9795, DOI: 10.1016/J.INTERMET.2011.05.003 [retrieved on May 28, 2011].

Shoda, Masahiro, "Seebeck Effect of Fe—Al—Si Alloy and Low Temperature Thermoelectric Properties", Tetsu to Hagane, 1998, vol. 84 No. 2, pp. 154-158.

Y. Takagiwa, et al., "Electronic structure and thermoelectric properties of narrow-band-gap intermetallic compound AL2FE3SI3", Journal of Thermal Analysis and Calorimetry, 2017, DOI: 10.1007/s10973-017-6621-9, Published online: Aug. 17, 2017.

Y. Shiota, et al., "A new semiconductor AL2FE3SI3 with complex crystal structure", Intermetallics, 2017, 89, 51-56.

\* cited by examiner

THERMOELECTRIC MATERIAL, METHOD FOR PRODUCING (MANUFACTURING) SAME AND THERMOELECTRIC POWER GENERATION MODULE USING SAME

TECHNICAL FIELD

The present invention relates to a thermoelectric material, a method for manufacturing the same, and a thermoelectric power generation module using the same.

BACKGROUND ART

Even in Japan, where energy conservation has been particularly advanced in the world, about ¾ of the primary supply energy is discarded as heat energy in the present state, and it is desired to establish a waste heat recovery technology and spread the thus-established technology. Under such a circumstance, a thermoelectric power generation module has been attracting attention as a solid-state device that can recover heat energy and directly convert the recovered heat energy into electric energy.

Recently, an Al—Fe—Si ternary intermetallic compound composed of only low-cost and non-toxic elements has been proposed as a thermoelectric material used for such a thermoelectric power generation module (for example, refer to Nonpatent Reference 1). Here, the thermoelectric material is generally a solid material characterized by being capable of mutual conversion between heat energy and electric energy, and is a material to be used to generate a temperature gradient in a heating or cooling device or to generate electric energy from waste heat. Then, a device capable of conversion between heat and electric power is formed using such a material. That is, when two different kinds of such materials (for example, metal or semiconductor) are connected and a temperature difference is generated between both ends, an electromotive force is generated, which is called the Seebeck effect. Conversely, when two different kinds of such materials (for example, metal or semiconductor) are connected and an electric current is applied, heat is transferred from one metal to the other, which is called the Peltier effect. Therefore, it can be said that a thermoelectric material has such a function that one technical field may be established as the thermoelectric material unlike the mere raw material. According to Nonpatent Reference 1, it has been reported that thermoelectric properties of p-type and n-type materials could be controlled by adjusting the carrier concentration based on the theoretical prediction using the first-principles calculation with respect to $Al_2Fe_3Si_3$. However, the composition range of specific thermoelectric materials exhibiting p-type and n-type thermoelectric properties has not yet been determined.

On the other hand, it has been reported that a single-phase synthesis of $Al_2Fe_3Si_3$ was successfully achieved by setting the composition to be 6 at % Al-rich with respect to the stoichiometric composition of $Al_2Fe_3Si_3$ (for example, refer to Nonpatent Reference 2). According to the Al—Fe—Si ternary phase diagram, it is known that $Al_2Fe_3Si_3$ exists in a relatively wide composition range and a single-phase synthesis of $Al_2Fe_3Si_3$ was successfully achieved by setting the composition of $Al_{26}Fe_{37}Si_{37}$ in Nonpatent Reference 2. In Nonpatent Reference 2, it is reported that the thus-obtained $Al_{26}Fe_{37}Si_{37}$ exhibits a p-type thermoelectric property, but it is still desired to further improve the property for the practical use and to synthesize an n-type thermoelectric material, too.

Although a large amount of the unused heat energy is occupied by the heat energy from the temperature of 200° C. or lower, it is desirable to develop a thermoelectric material composed of only low-cost and non-toxic elements which is suitable for recovering heat energy such as so-called poor heat.

PRIOR ART REFERENCE

Nonpatent Reference

Nonpatent Reference 1

Y. Takagiwa et. al., Journal of Thermal Analysis and calorimetry, 2017, DOI:10.1007/s10973-017-6621-9, Published online: 17 Aug. 2017

Nonpatent Reference 2

Y. Shiota, et. al., Intermetallics, 2017, 89, 51-56

SUMMARY OF INVENTION

Problem to be Solved by Invention

As described above, it is an object of the present invention to provide a thermoelectric material including an Al—Fe—Si intermetallic compound as a main component and exhibiting a thermoelectric effect in a temperature range from the room temperature to 600° C., which can be an n-type material or a p-type material by controlling each composition thereof; a method of manufacturing/producing the thermoelectric material; and a thermoelectric generation module utilizing the thermoelectric material.

Means to Solve Problem

A thermoelectric material according to the present invention includes at least an intermetallic compound including Al, Fe, and Si, and the intermetallic compound is represented by a general formula of $Al_{12+p-q}Fe_{38.5+3q}Si_{49.5-p-2q}$ (Here, p satisfies condition of $0 \leq p \leq 16.5$ and q satisfies condition of $-0.34 \leq q \leq 0.34$.) and the intermetallic compound contains a phase represented by $Al_2Fe_3Si_3$ as a main phase, whereby the above-mentioned problem is resolved.

A value of the p may satisfy $0 \leq p \leq 10$ and the thermoelectric material may be n-type in a temperature range from the room temperature to 600° C. or less.

A value of the p may satisfy $8 \leq p \leq 9$ and the thermoelectric material may be n-type in a temperature range from the room temperature to 600° C. or less.

A value of the p may satisfy $10 \leq p \leq 16.5$ and the thermoelectric material may be p-type in a temperature range from the room temperature to 600° C. or less.

A value of the p may satisfy $11 \leq p \leq 12$ and the thermoelectric material may be p-type in a temperature range from the room temperature to 600° C. or less.

The intermetallic compound may contain at least 70 wt % of a phase represented by $Al_2Fe_3Si_3$.

The intermetallic compound may further contain a phase represented by ε-FeSi.

The intermetallic compound may contain a phase represented by ε-FeSi in a range of at least 0.5 wt % and less than 10 wt %.

A method of manufacturing the above-mentioned thermoelectric material according to the present invention comprises the steps of: mixing a raw material including Al, a raw material including Fe, and a raw material including Si such that a mixture thereof may satisfy a general formula of $Al_{23.5+x}Fe_{36.5+y}Si_{40-x-y}$ (Here, x and y satisfy $-7.25<x<12$ and $-0.5\leq y\leq 1.5$, respectively.) and melting a mixture obtained by the step of mixing and causing the mixture to react with each other, thereby solving the above-mentioned problem.

A value of the x may satisfy $-7.25<x<3$ in the step of mixing.

A value of the x may satisfy $1.5\leq x\leq 2.5$ in the step of mixing.

A value of the x may satisfy $3\leq x<12$ in the step of mixing.

A value of the x may satisfy $3.5\leq x\leq 4$ in the step of mixing.

The mixture may be heated in an inert atmosphere in a temperature range from 1500° C. or higher to 2200° C. or lower in the step of melting and causing reaction.

The method may further include the step of sintering a reactant obtained by the step of melting and causing reaction.

The step of sintering may include pulverizing the reactant and pulse electric current sintering the pulverized reactant.

The step of sintering may include sintering it in a pressure range from 10 MPa or higher to 200 MPa or lower in a temperature range from 800° C. or higher to 1000° C. or lower.

The method may further include the step of molding a sintered body obtained in the step of sintering.

A thermoelectric generation module according to the present invention includes an n-type thermoelectric material and a p-type thermoelectric material alternately connected in series, and at least one of the n-type thermoelectric material and the p-type thermoelectric material is the thermoelectric material described above, thereby solving the above-mentioned problem.

The n-type thermoelectric material may be the above-mentioned thermoelectric material satisfying $0\leq p<10$ or $8\leq p\leq 9$, and the p-type thermoelectric material may be the above-mentioned thermoelectric material satisfying $10\leq p\leq 16.5$ or $11\leq p\leq 12$.

Effect of Invention

The thermoelectric material according to the present invention includes at least Al, Fe, and Si, and is represented by a general formula of $Al_{12+p-q}Fe_{38.5+3q}Si_{49.5-p-2q}$ (Here, p satisfies $0\leq p\leq 16.5$ and q satisfies $-0.34\leq q\leq 0.34$.), and has a phase represented by $Al_2Fe_3Si_3$ as a main component. Since Al, Fe, and Si are included, cost reduction for providing the device can be achieved. Further, when the above-mentioned general formula is satisfied, the material can have a phase represented by $Al_2Fe_3Si_3$ as a main phase and exhibit excellent thermoelectric properties in a temperature range from the room temperature to 600° C. or less. In particular, since production of n-type or p-type can be controlled by controlling the parameter p, n-type and p-type thermoelectric materials can be provided in the same alloy system. If n-type and p-type thermoelectric materials in the same alloy system are used, it is advantageous to make a device of a thermoelectric power generation module since they have the same thermal expansion coefficient.

A method of manufacturing a thermoelectric material according to the present invention includes the steps of: mixing raw materials including Al, Fe, and Si to satisfy a general formula of $Al_{23.5+x}Fe_{36.5+y}Si_{40-x-y}$ (Here, x and y satisfy $-7.25<x<12$ and $-0.5\leq y\leq 1.5$, respectively.) and melting the thus-obtained mixture so as to cause the mixture to react with each other. In the preparation of the raw materials, the above-mentioned thermoelectric material can be obtained by mixing the raw materials so as to satisfy the above-mentioned general formula such that the thermoelectric material can be provided at low cost and with high yield while a special technique is not necessary.

EMBODIMENT OF CARRYING OUT INVENTION

Figure 1A:
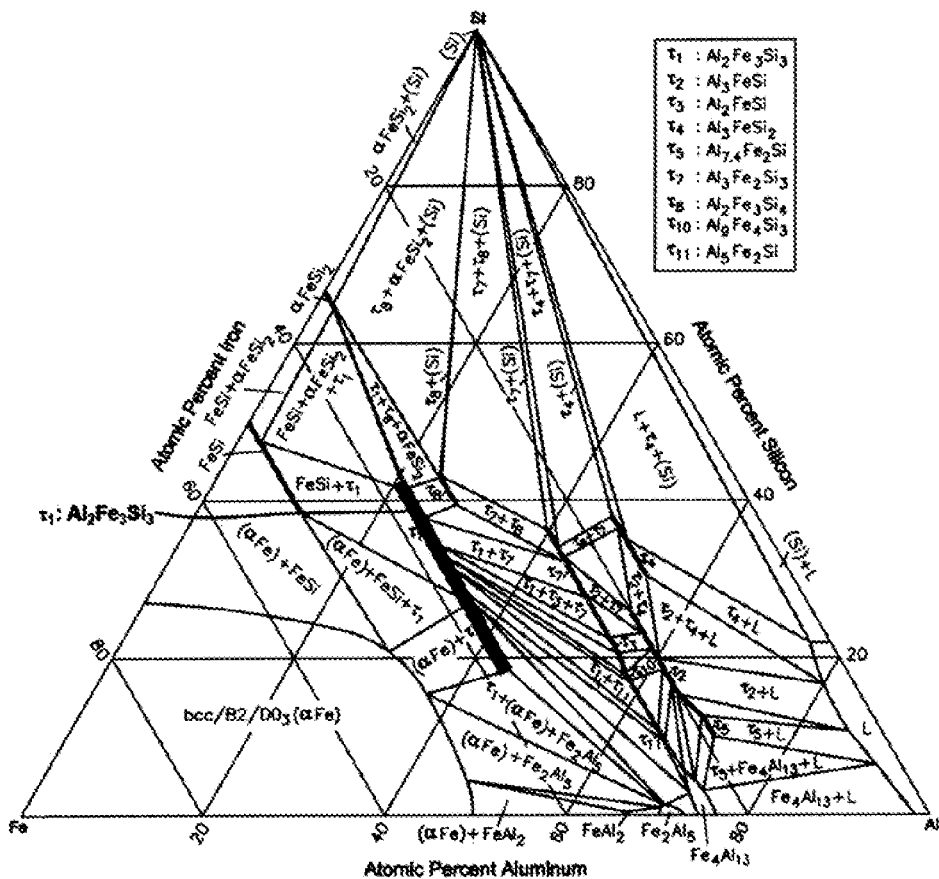
FIG. 1A shows a diagram illustrating an Al—Fe—Si ternary phase diagram showing a thermoelectric material according to the present invention.

Hereinafter, with reference to the drawings, embodiments of the present invention will be described. It is to be noted that like reference numerals designate identical or corresponding components and descriptions thereof will be omitted.

Embodiment 1

In Embodiment 1, a thermoelectric material according to the present invention and a method of manufacturing the material are described.

Figure 1B:
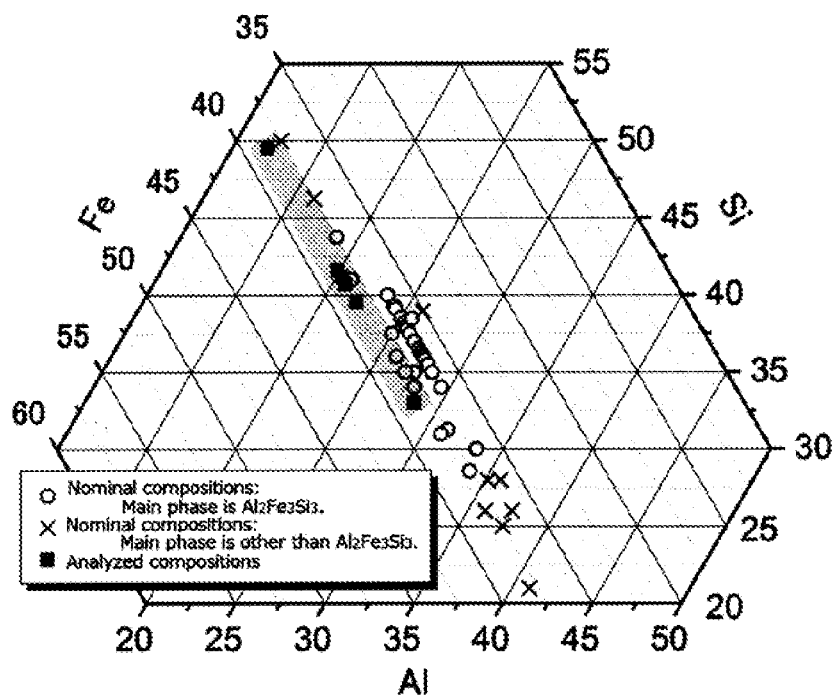
FIG. 1B shows a diagram illustrating a partially enlarged view of an Al—Fe—Si ternary phase diagram showing a thermoelectric material according to the present invention.

FIGS. 1A and 1B show diagrams illustrating an Al—Fe—Si ternary phase diagram indicating a thermoelectric material according to the present invention.

FIG. 1A shows a diagram illustrating an Al—Fe—Si ternary phase diagram reported in Raghavan V., J. Phase Equilibria Diffus., 2009, Vol. 30(2), pp 184-188. In FIG. 1A, a region that appears in black is a phase represented by $Al_2Fe_3Si_3$ (hereinafter simply referred to as $Al_2Fe_3Si_3$ phase), and it can be seen that the region has a wide composition range.

FIG. 1B shows an enlarged view of the $Al_2Fe_3Si_3$ phase and so on, as shown in FIG. 1A. The region that appears in gray is a region in which the $Al_2Fe_3Si_3$ phase is the main phase based on the components obtained by analyzing the melted material components reacted with each other. Further, intermetallic compounds constituting the main component of the thermoelectric material according to the present invention are also plotted with o and x based on nominal compositions derived from constituents of the raw materials. Specifically, a thermoelectric material according to the present invention includes at least Al (aluminum), Fe (iron), and Si (silicon) and includes an intermetallic compound represented by the following general formula (1). Here, p satisfies $0 \leq p \leq 16.5$, and q satisfies $-0.34 \leq q \leq 0.34$. This intermetallic compound includes an $Al_2Fe_3Si_3$ phase as a main phase.

$$Al_{12+p-q}Fe_{38.5+3q}Si_{49.5-p-2q} \quad (1)$$

Here, if substituting q=0 in the general formula (1), the formula corresponds to $Al_{12+p}Fe_{38.5}Si_{49.5-p}$. And that the q changes within the predetermined range corresponds to that the composition changes from $Al_{12+p}Fe_{37.5}Si_{49.5-p}$ to $Al_{12+p}Fe_{39.5}Si_{49.5-p}$.

The present inventor has found from various experiments to be described later that the intermetallic compound having the above-mentioned specific composition may have functions as a thermoelectric material among the phases represented by $Al_2Fe_3Si_3$. In the general formula (1), when the parameter p is less than 0 or more than 16.5, the crystal structure tends to be unstable, and the $Al_2Fe_3Si_3$ phase does not tend to be the main phase. And if q is less than −0.34, or if q is more than 0.34, it is not likely that the desired crystal phase becomes the main phase.

Here, in the specification of the present application, the percentage of the main phase in the intermetallic compound according to the present invention may be 70 wt % or more. If the main phase is less than 70 wt %, a sufficient thermoelectric effect may not be obtained. The percentage of the main phase is preferably 80 wt % or more, and more preferably 90 wt % or more. It should be understood that an intermetallic compound according to the present invention is preferably composed of a single phase of the main phase and that the upper limit of the percentage of the main phase is 100 wt %, but it is not necessarily required that the intermetallic compound is composed of the single phase in order to generate the thermoelectric effect. Here, a method of measuring a ratio of such a phase includes an X-ray diffraction measurement in which a phase identification (a main phase and a secondary phase) can be performed from information of peak positions and peak intensities based on data of X-ray diffraction patterns measured within a range of the d value (from 7 Å to 1 Å) such that a ratio of crystallized phase can be calculated from an integrated intensity ratio of the highest peak so as to determine what is the main phase (for example, the RIR (Reference Intensity Ratio) method).

Figure 1C:
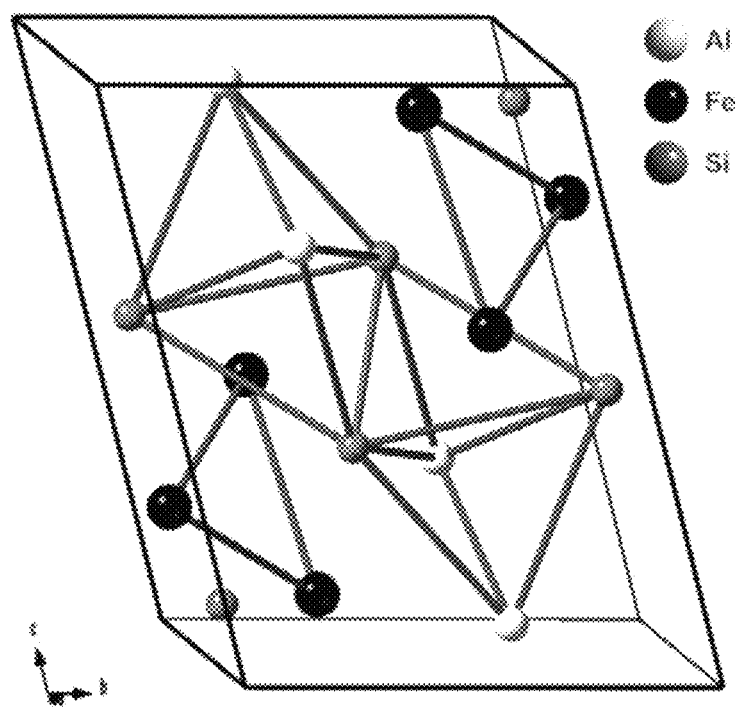
FIG. 1C shows a diagram illustrating a crystal structure of $Al_2Fe_3Si_3$ crystal.
Figure 1D:
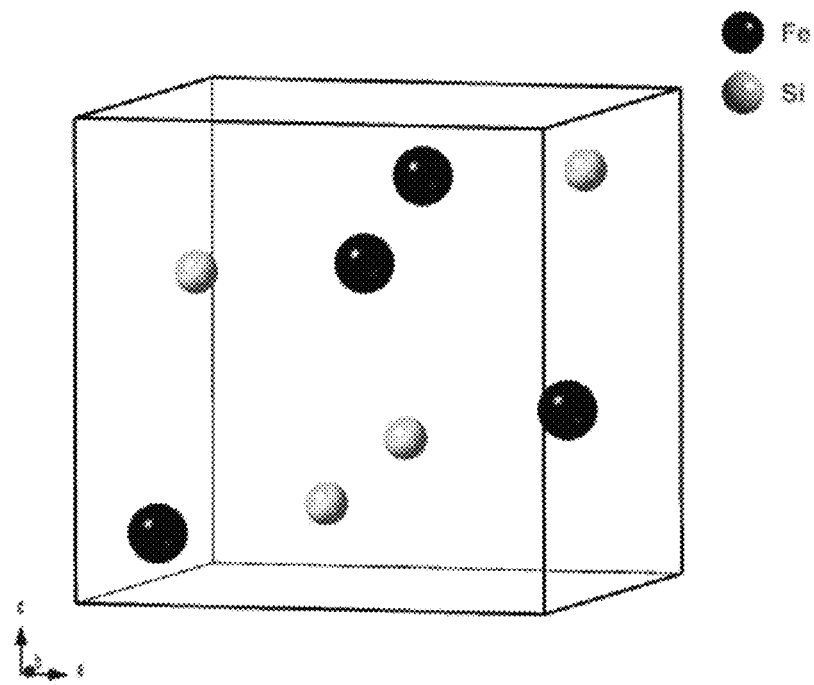
FIG. 1D shows a diagram illustrating a crystal structure of ε-FeSi crystal.

An intermetallic compound according to the present invention includes an $Al_2Fe_3Si_3$ phase as a main phase, and may include a phase represented by ε-FeSi (hereinafter simply referred to as ε-FeSi phase) as a secondary phase. FIGS. 1C and 1D show crystal structures of the $Al_2Fe_3Si_3$ phase and the ε-FeSi phase, respectively. The ε-FeSi phase does not affect the conduction type of the thermoelectric material, but can improve the electrical conductivity such that the power factor (output factor) can be improved. The ε-FeSi phase may be ε-FeSi, but also includes an ε-FeSi phase having a shifted composition as a main phase. That is, the basic crystal structure is the same as the crystal structure of ε-FeSi, but a phase thereof having a shifted composition due to solid solution or the like is also included. Further, even if there are those of which specific crystal structures cannot be identified around ε-FeSi, they can be treated as what is included in the ε-FeSi phase. In consideration of improving the electrical conductivity, it is desirable that the ε-FeSi phase is included in a range of 0.5 wt % or more and less than 10 wt %. Other secondary phases may include $Fe_5Si_3$, $Fe_4Al_{23}$, $FeSi_2$, $Al_2Fe_3Si_4$, and so on. Identification of the main phase and the secondary phase and calculation of contents thereof can be performed by the X-ray diffraction or the neutron diffraction. In a simplified manner, it can be easily determined whether the obtained alloy is the $Al_2Fe_3Si_3$ phase or not by comparing the X-ray diffraction pattern in FIG. 4 to be described later with that of the objective alloy for comparison. It may be good to make a judgment using approximately ten peaks of the highest intensity in the diffraction pattern as the main peaks of the $Al_2Fe_3Si_3$ phase.

Furthermore, the present inventor has found that the objective alloy can be controlled to be in a specific conduction type of an n-type or a p-type by adjusting the composition of the intermetallic compound represented by the general formula (1).

In an embodiment according to the present invention, in the general formula (1), when the parameter p satisfies $0 \leq p < 10$, a thermoelectric material including such an intermetallic compound may exhibit the n-type. In an embodiment of the present invention, such a thermoelectric material can exhibit the n-type at least in a temperature range from the room temperature to 600° C. More preferably, the parameter p satisfies $8 \leq p \leq 9$. Thereby, in an embodiment according to the present invention, a thermoelectric material can exhibit the n-type having a large Seebeck coefficient (absolute value) at least in a temperature range from the room temperature to 600° C. In addition, in the specification of the present application, it is intended that the room temperature refers to a temperature range of 15° C. or higher and 35° C. or lower.

In the general formula (1), when the parameter p satisfies $10 \leq p \leq 16.5$, a thermoelectric material including such an intermetallic compound may exhibit the p-type. Thereby, in an embodiment according to the present invention, the thermoelectric material can exhibit the p-type at least in a temperature range from the room temperature to 600° C. More preferably, the parameter p satisfies $11 \leq p \leq 12$. Thereby, in an embodiment according to the present invention, a thermoelectric material can exhibit the p-type having a large Seebeck coefficient at least in a temperature range from the room temperature to 600° C.

In an embodiment according to the present invention, as far as the thermoelectric material includes the intermetallic compound represented by the above-mentioned general formula (1), the form of the intermetallic compound included in the thermoelectric material is not limited, but may be that such as a powder, a sintered body, a thin film, and so on. In an embodiment according to the present invention, a thermoelectric material has the above-mentioned intermetallic compound as a main component and the thermoelectric material may include an additive in addition to the above-mentioned intermetallic compound, for example, if the form thereof is a sintered body or a powder. From such a viewpoint, in the specification of the present application, the amount of the main component of the intermetallic compound may be 70 wt % or more. If it is less than 70 wt %, a sufficient thermoelectric effect may not be achieved. The additive may be a sintering aid, a binder, or the like. Further, in an embodiment of the present invention, the thermoelectric material may include unavoidable impurities such as C (carbon) and Al oxide (alumina) which are mixed in the production step. The content amounts of such inevitable impurities are not limited as long as the thermoelectric performance is not reduced, but may be preferably 0.15 wt % or less.

Next, in an embodiment of the present invention, an exemplary method of manufacturing a thermoelectric material will be described. Here, an explanation thereof will be made in the case where the thermoelectric material is a bulk or a powder.

Figure 2:
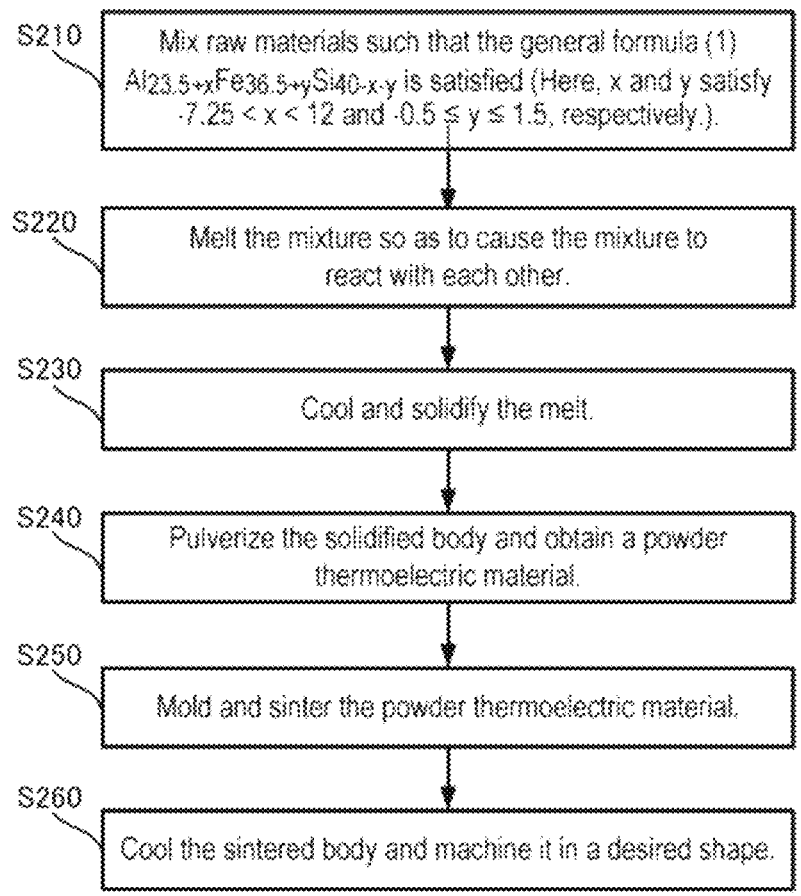
FIG. 2 shows a flowchart illustrating steps of manufacturing a thermoelectric material according to the present invention.

FIG. 2 shows a flowchart illustrating steps of manufacturing a thermoelectric material according to the present invention.

First, in the step S210, a raw material including Al, a raw material including Fe, and a raw material including Si are mixed so as to satisfy the following general formula (2).

$$Al_{23.5+x}Fe_{36.5+y}Si_{40-x-y} \qquad (2)$$

Here, x and y satisfy $-7.25<x<12$ and $-0.5\leq y\leq 1.5$, respectively. The present inventor has found that a thermoelectric material including an intermetallic compound of the present invention which satisfies the above-mentioned general formula (1) could be obtained by mixing raw materials containing Al, Fe, and Si so as to satisfy the above-mentioned general formula (2).

The raw material including Al, the raw material including Fe, and the raw material including Si may be Al metal simple substance, Fe metal simple substance, and Si metal simple substance, respectively, while, for example, Al silicide, oxide, carbonate, nitride, oxynitride, chloride, fluoride, and oxyfluoride; Fe silicide, oxide, carbonate, nitride, oxynitride, chloride, fluoride, and oxyfluoride; and Si silicides, oxide, carbonate, nitride, oxynitride, chloride, fluoride, and oxyfluoride may be employed. In such a case, the respective metal elements may also be mixed so as to satisfy the general formula (2). Raw materials are preferably in the form of powder, granule, and small lump from the viewpoint of mixability and handling.

Further, the present inventor has found that a thermoelectric material of the present invention in which the conduction type of the n-type and the p-type is controlled by adjusting the mixture composition represented by the general formula (2) with respect to the same alloy as mentioned above could be manufactured.

In the general formula (2), if the raw materials are mixed such that the parameter x may satisfy $-7.25<x<3$, an n-type thermoelectric material in which the parameter p satisfies $0\leq p\leq 10$ in the general formula (1) can be manufactured. More preferably, the raw materials are mixed such that the parameter x satisfies $1.5\leq x\leq 2.5$ in the general formula (2). Thereby, an n-type thermoelectric material in which the parameter p satisfies $8\leq p\leq 9$ in the general formula (1) can be manufactured.

In the general formula (2), if the raw materials are mixed such that the parameter x may satisfy $3\leq x<12$, an p-type thermoelectric material in which the parameter p satisfies $10\leq p<16.5$ in the general formula (1) can be manufactured. More preferably, if the raw materials are mixed such that the parameter x satisfies $3.5\leq x\leq 4$ in the general formula (2), a p-type thermoelectric material in which the parameter p satisfies $11\leq p<12$ in the general formula (1) can be manufactured.

As described above, since the n-type and the p-type can be controlled only by controlling the parameter x in the general formula (2), a thermoelectric material according to the present invention can be manufactured with a high yield productivity without requiring sophisticated skills.

In the step S220, the mixture obtained in the step S210 is melted so as to cause the melt to react with each other. Melting the mixture and causing the melt to react with each other may be performed by heating the mixture to a temperature at which the mixture is melted and, for example, the mixture is heated to a temperature in the range of 1500° C. or higher and 2200° C. or lower. Melting the mixture and reacting with each other are preferably carried out at an atmospheric pressure, in less than the atmospheric pressure, or in more than the atmospheric pressure in an inert atmosphere which is nitrogen or a rare gas such as argon, helium, and so on. Melting the mixture and reacting with each other may be performed for example by an arc melting or a high frequency induction heat melting. The reactant having been melted and reacted with each other is cooled to become a solidified body (step S230). In this stage, the melted reactant having reacted with each other may be quenched by casting the reaction product into a mold. For example, the reaction product may be quenched from 2000° C. to about 100° C. at a cooling rate such as 200° C./sec or higher.

The thus-obtained reaction product (solidified body) is come to be a thermoelectric material according to the present invention. And if the solidified body is pulverized, a resultant product can be provided in a powder product as a thermoelectric material according to the present invention.

After the reaction product (solidified body) obtained in the step S220 is cooled (step 230), the solidified body is pulverized (step S240), thus-obtained powder raw material is molded and sintered (step S250), and then, a thermoelectric material can be provided as a sintered body according to the present invention. By way of example, the reaction product is pulverized (step 240) and a compact therefrom is molded into a predetermined shape such that sintering of the compact is performed under a pressure range of 10 MPa or higher and 200 MPa or lower in a temperature range of 800° C. or higher and 1000° C. or lower. The sintering time is not particularly limited, but the sintering can be performed within one minute. Although it depends on the temperature and other conditions, it may be several minutes, for example, 5 minutes or more in consideration of easiness of industrial handling. If it is too long, it consumes a lot of energy such that a time period of 12 hours or less may be realistic. With respect to the sintering, an ordinary hot-pressing method may be employed, but it can be performed in a short period of time if the pulse current sintering method is employed. The sintering is preferably performed in an inert atmosphere.

Here, the pulverization of the solidified body for the sintering process may be preferably performed until a mean particle diameter (d50) thereof may be 50 μm or less. Thereby, the sintering effect to be described later can be promoted. Preferably, the solidified body is pulverized into particles having a mean particle diameter of 45 μm or less. Thereby, the sintering and heat treatment can be promoted, and the processing time can be shortened. The pulverization is performed by a publicly-known method such as a ball milling, an automatic mortar, a vibration milling, and so on. In general, the mean particle diameter can be defined as follows. In the measurement by the sedimentation method, the particle diameter is defined as the diameter of an equivalent sphere having the same sedimentation rate, and in the laser scattering method, it is defined as the diameter of an equivalent sphere having the same scattering characteristics. Further, the distribution of particle diameters is called the particle size (particle diameter) distribution. In the particle diameter distribution, a specified particle diameter is defined as the mean particle diameter D50 when the total mass of powder particles having diameters larger than the specified particle diameter is 50% of the total mass of the entire powder body. These definitions and terms are well known to the one skilled in the art and are set out in various documents such as JIS Z 8901 "Powder Body for Test and Particle for Test" and the first chapter of "Basic Physical Properties of Powder" edited by The Society of Powder Technology, Japan (ISBN4-526-05544-1). The particle diameter corresponding to that at 50% in the integrated (cumulative) frequency distribution was obtained and defined as the mean particle diameter D50. As for the means for determining the mean particle diameter, various kinds, have been developed and the development is continuing, so that the value measured by a newly developed means may differ slightly. However, it should be understood that the meaning and significance of the mean particle diameter itself is definite, and the means for measuring the mean particle diameter is not necessarily limited to the above-mentioned means.

The thus-obtained sintered body may be machined (cut) using a high-speed cutter, a wire saw, or the like (S260), and thus-machined product may be employed in a thermoelectric power generation module. Further, if the thus-obtained sintered body is used as a target in a physical vapor deposition method, the thermoelectric material according to the present invention can be provided as a thin film.

Embodiment 2

In Embodiment 2, a thermoelectric generation module using the thermoelectric material according to the present invention described in Embodiment 1 will be described.

Figure 3:
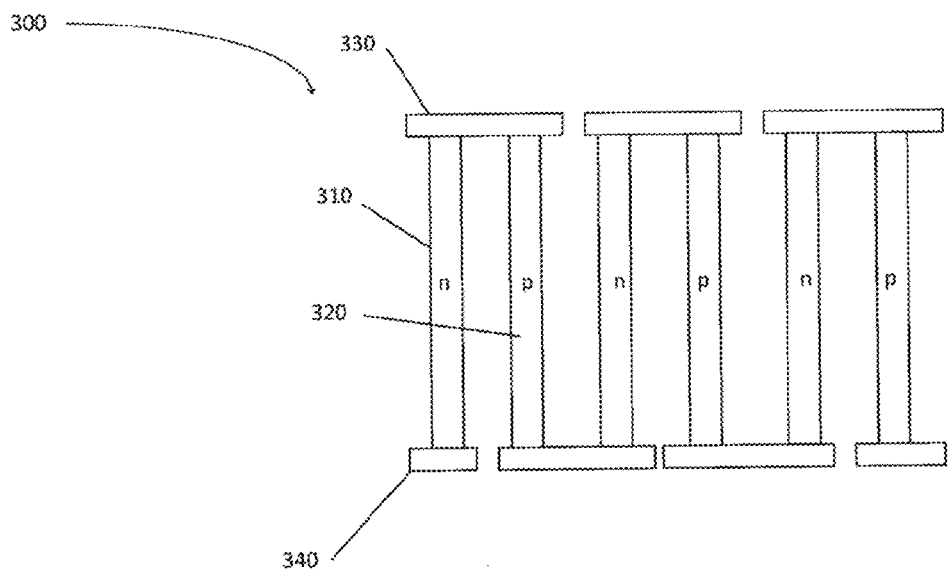
FIG. 3 shows a schematic view illustrating a thermoelectric power generation module utilizing a thermoelectric material according to the present invention.

FIG. 3 shows a schematic view illustrating a thermoelectric generation module using the thermoelectric material according to the present invention.

A thermoelectric generation module 300 according to the present invention includes a pair of n-type thermoelectric material 310 and p-type thermoelectric material 320, and electrodes 330, 340 at their respective ends. The electrodes 330 and 340 electrically connect the n-type thermoelectric material 310 and the p-type thermoelectric material 320 in series.

Here, the n-type thermoelectric material 310 and the p-type thermoelectric material 320 are thermoelectric materials according to the present invention as described in Embodiment 1. Since the n-type and p-type thermoelectric materials of the same alloy having the same thermal expansion coefficient are used, it is advantageous to make a device of a thermoelectric power generation module 300 according to the present invention. The electrodes 330 and 340 may be made of an ordinary electrode material such as Al, Ni, Cu, and the like, by way of example.

In the thermoelectric power generation module 300 according to the present invention, when a temperature difference occurs between the electrodes 330 and 340, an electromotive force is generated due to the Seebeck effect such that electric power can be obtained. In the present invention, a thermoelectric material according to the present invention described in Embodiment 1 is used as a n-type thermoelectric material 310 and a p-type thermoelectric material 320 such that a thermoelectric power generation module 300 having a large power generation amount in a wide temperature range from the room temperature to 600° C. can be realized. In particular, when a thin film is used as a thermoelectric material, a flexible thermoelectric power generation module can be provided as an IoT power supply.

Although an explanation is made with respect to a n-shaped thermoelectric power generation module in FIG. 3, a thermoelectric material according to the present invention may also be used for a U-shaped thermoelectric power generation module (not shown). In this case, similarly, the n-type thermoelectric material and the p-type thermoelectric material made of the thermoelectric material according to the present invention are alternately connected electrically in series.

Hereinafter, embodiments according to the present invention will be described more specifically with reference to examples and comparative examples, but the present invention is not limited to the scope of these examples.

EXAMPLE

Examples and Comparative Examples: 1~19

In Examples and Comparative Examples 1 to 19, thermoelectric materials in the forms of powder and sintered body were manufactured by adjusting various compositions of raw materials such that $-7.25 \leq x \leq 12$ and $-0.5 \leq y \leq 1.5$ were satisfied in the general formula (2).

Al (powder, purity: 99.99%, manufactured by Kojundo Chemical Laboratory Co., Ltd.), Fe (granule, purity: 99.99%, manufactured by Kojundo Chemical Laboratory Co., Ltd.), and Si (small lump, purity: 99.999%, manufactured by Kojundo Chemical Laboratory Co., Ltd.) were mixed in accordance with the nominal compositions as shown in Table 1 (step S210 in FIG. 2).

TABLE 1

Nominal compositions and mixture compositions of raw materials of Examples/Comparative examples 1 to 19

| Examples/Comparative examples | $Al_{23.5+x}Fe_{36.5+y}Si_{40-x-y}$ | | Al | Fe | Si |
|---|---|---|---|---|---|
| | x | y | (at %) | (at %) | (at %) |
| Comparative example 1 | −7.25 | 1 | 16.25 | 37.5 | 46.25 |
| Example 2 | 0 | 0 | 23.5 | 36.5 | 40 |
| Example 3 | 0.7 | 0 | 24.2 | 36.5 | 39.3 |
| Example 4 | 0.9 | 0 | 24.4 | 36.5 | 39.1 |
| Example 5 | 1.5 | 0 | 25 | 36.5 | 38.5 |
| Example 6 | 1.8 | 0 | 25.3 | 36.5 | 38.2 |
| Example 7 | 2 | 0 | 25.5 | 36.5 | 38 |
| Example 8 | 2.2 | 0 | 25.7 | 36.5 | 37.8 |
| Example 9 | 3 | 0 | 26.5 | 36.5 | 37 |
| Example 10 | 3.5 | 0 | 27 | 36.5 | 36.5 |
| Example 11 | 3.7 | 0 | 27.2 | 36.5 | 36.3 |
| Example 12 | 3.9 | 0 | 27.4 | 36.5 | 36.1 |
| Example 13 | 4 | 0 | 27.5 | 36.5 | 36 |
| Example 14 | 4.2 | 0 | 27.7 | 36.5 | 35.8 |
| Example 15 | 4.5 | 0 | 28 | 36.5 | 35.5 |
| Example 16 | 5 | 0 | 28.5 | 36.5 | 35 |
| Example 18 | 6 | 0 | 29.5 | 36.5 | 34 |
| Example 18 | 10 | 0 | 33.5 | 36.5 | 30 |
| Comparative example 19 | 12 | 0 | 35.5 | 36.5 | 28 |

Each mixture was placed on a Cu hearth of an arc melting furnace apparatus (NEV-AD03, manufactured by Nissin Giken Corporation) and melted so as to react with each other in an argon atmosphere (step S220 in FIG. 2). The mixture was heated to an elevated temperature of about 2000° C. so as to melt and react with each other. The melted reaction product was cooled so as to be a solidified body. Next, in order to enhance the homogeneity of the solidified body, the solidified body was inverted, re-melted, and reacted, and further cooled such that a solidified body was obtained (S230).

Figure 4:
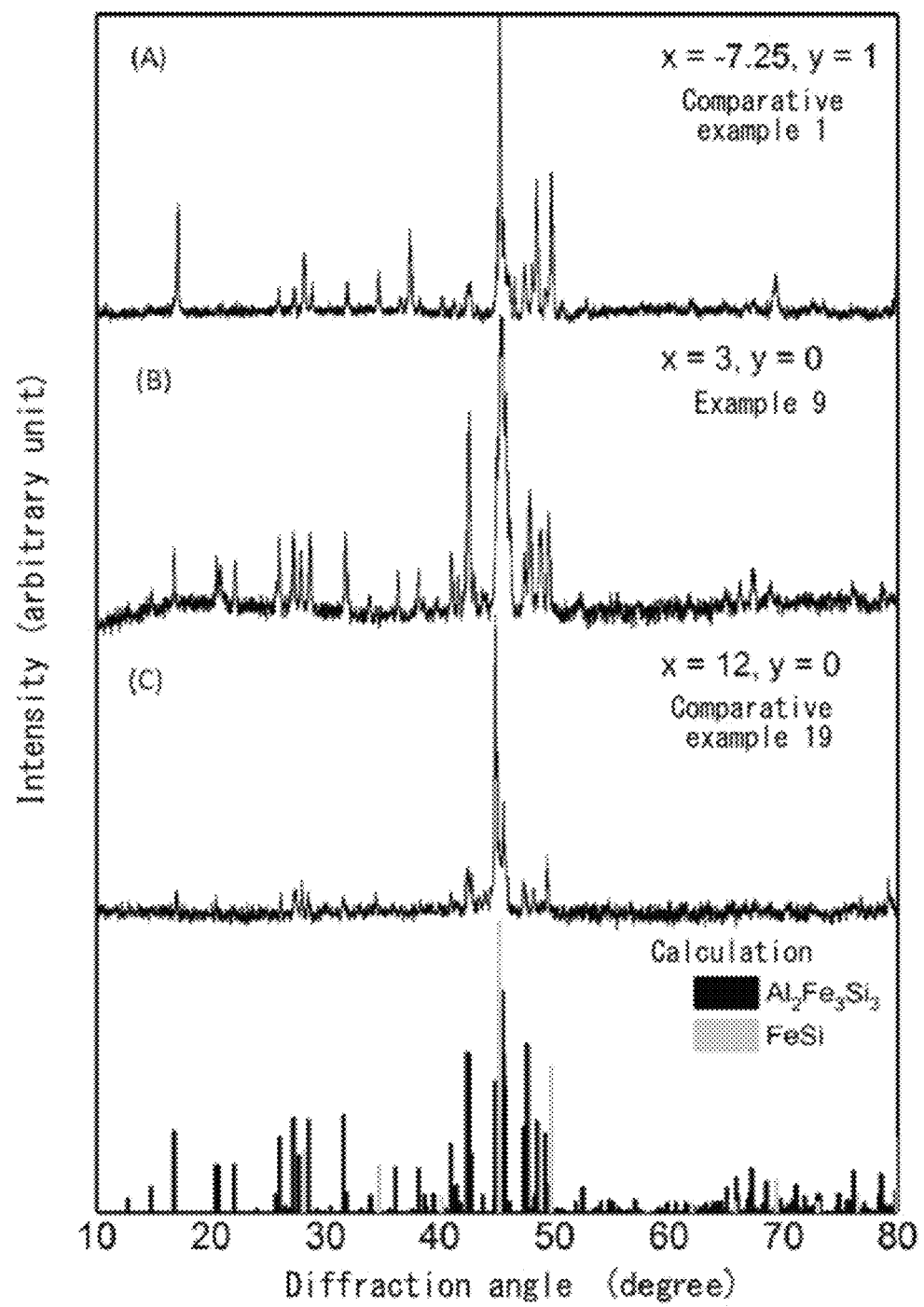
FIG. 4 shows a diagram illustrating X-ray diffraction patterns of samples of Comparative Examples 1 and 19 and Example 9.

The thus-obtained solidified boy was ground in a wet condition using ethanol with an agate mortar (S240). Particles of the thus-ground solidified body were sieved with a mesh (mesh size: 45 μm), and only particles (powder) having a particle size of 45 μm or less that passed through the mesh were taken out. The particles were identified by the powder X-ray diffraction method (SmartLab or Mini-Flex600, manufactured by Rigaku Corporation), and a composition analysis was performed with the X-ray fluorescence analysis (Orbis I, manufactured by EDAX Inc.). The results are shown in FIG. 4 and Tables 3, 4, and 6 and will be described later.

Figure 5:
FIG. 5 shows a diagram illustrating an outer appearance of a sample of Example 18.

Next, the particles were sintered (S250). A disc-shaped sintered body having a diameter of about 10 mm and a thickness of about 1.5-2.0 mm was obtained under the sintering conditions as shown in Table 2 by the pulse current sintering method (SPS-515S, manufactured by Fuji Electronic Industrial Co., Ltd.; LABOX-110MC, manufactured by SinterLand Inc.). Each outer appearance of the thus-obtained sintered bodies was observed. The results are shown in FIG. 5 and will be described later.

TABLE 2

Sintering conditions of Examples/Comparative examples 1 to 19

| Examples/Comparative examples | $Al_{23.5+x}Fe_{36.5+y}Si_{40-x-y}$ | | Sintering temperature (° C.) | Sintering pressure (MPa) | Sintering time (Minute) |
|---|---|---|---|---|---|
| | x | y | | | |
| Comparative example 1 | −7.25 | 1 | — | — | — |
| Example 2 | 0 | 0 | 920 | 57.4 | 12 |
| Example 3 | 0.7 | 0 | 910 | 57.4 | 9 |
| Example 4 | 0.9 | 0 | 940 | 57.4 | 9 |
| Example 5 | 1.5 | 0 | 930 | 57.4 | 10 |
| Example 6 | 1.8 | 0 | 940 | 57.4 | 13 |
| Example 7 | 2 | 0 | 940 | 57.4 | 13 |
| Example 8 | 2.2 | 0 | 930 | 57.4 | 11 |
| Example 9 | 3 | 0 | 940 | 57.4 | 8 |
| Example 10 | 3.5 | 0 | 940 | 57.4 | 8 |
| Example 11 | 3.7 | 0 | 950 | 57.4 | 10 |
| Example 12 | 3.9 | 0 | 930 | 57.4 | 10 |
| Example 13 | 4 | 0 | 970 | 57.4 | 9 |
| Example 14 | 4.2 | 0 | 940 | 57.4 | 8 |
| Example 15 | 4.5 | 0 | 950 | 57.4 | 10 |
| Example 16 | 6 | 0 | 980 | 57.4 | 12 |
| Example 18 | 6 | 0 | 940 | 57.4 | 13 |
| Example 18 | 10 | 0 | 970 | 57.4 | 10 |
| Comparative example 19 | 12 | 0 | — | — | — |

Figure 6:
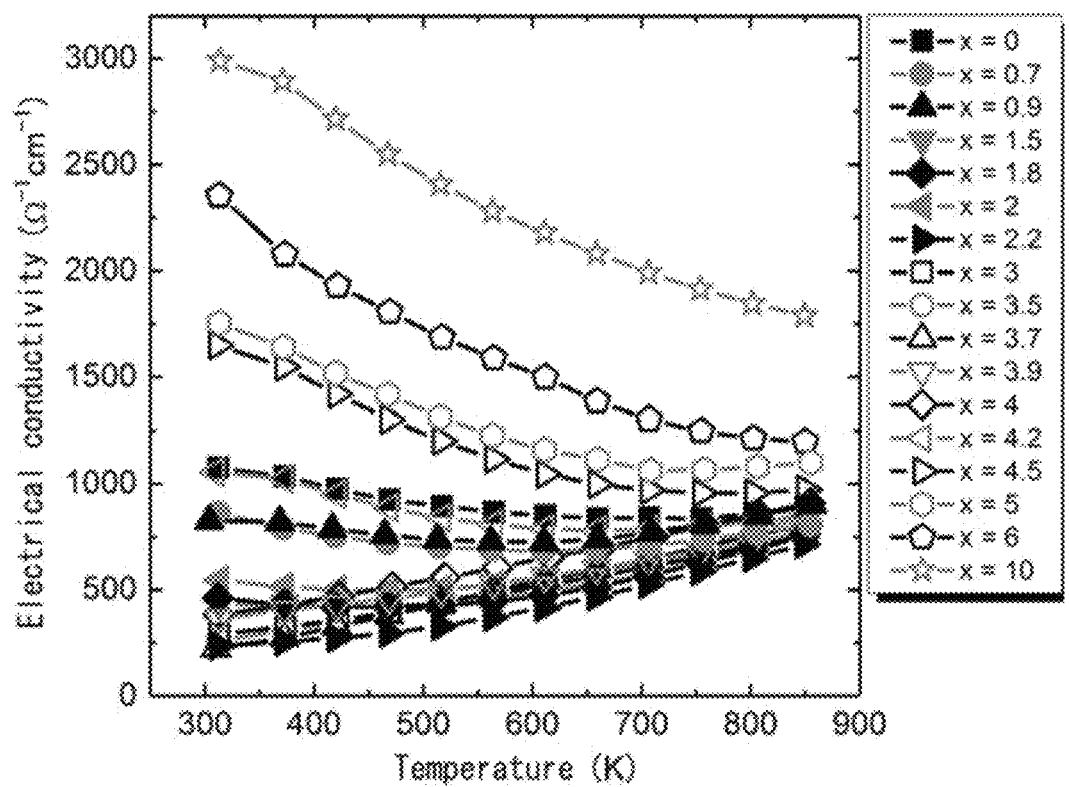
FIG. 6 shows a diagram illustrating temperature dependence of electrical conductivities of samples of Examples 2 to 18.
Figure 7:
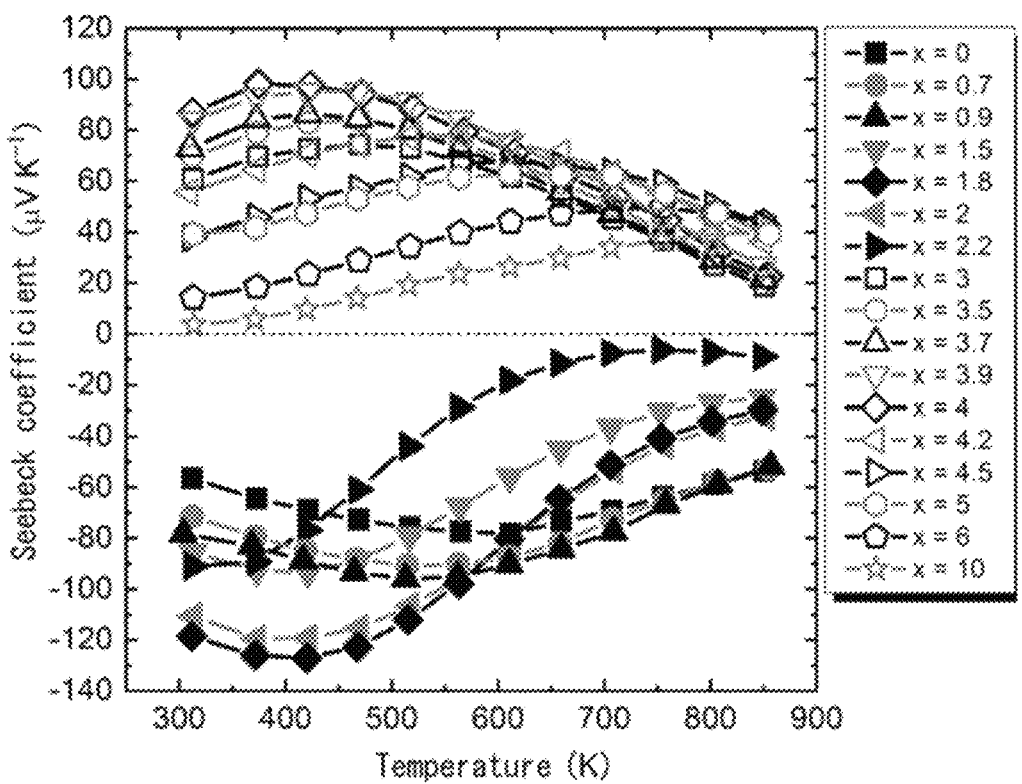
FIG. 7 shows a diagram illustrating temperature dependence of Seebeck coefficients of samples of Examples 2 to 18.
Figure 8:
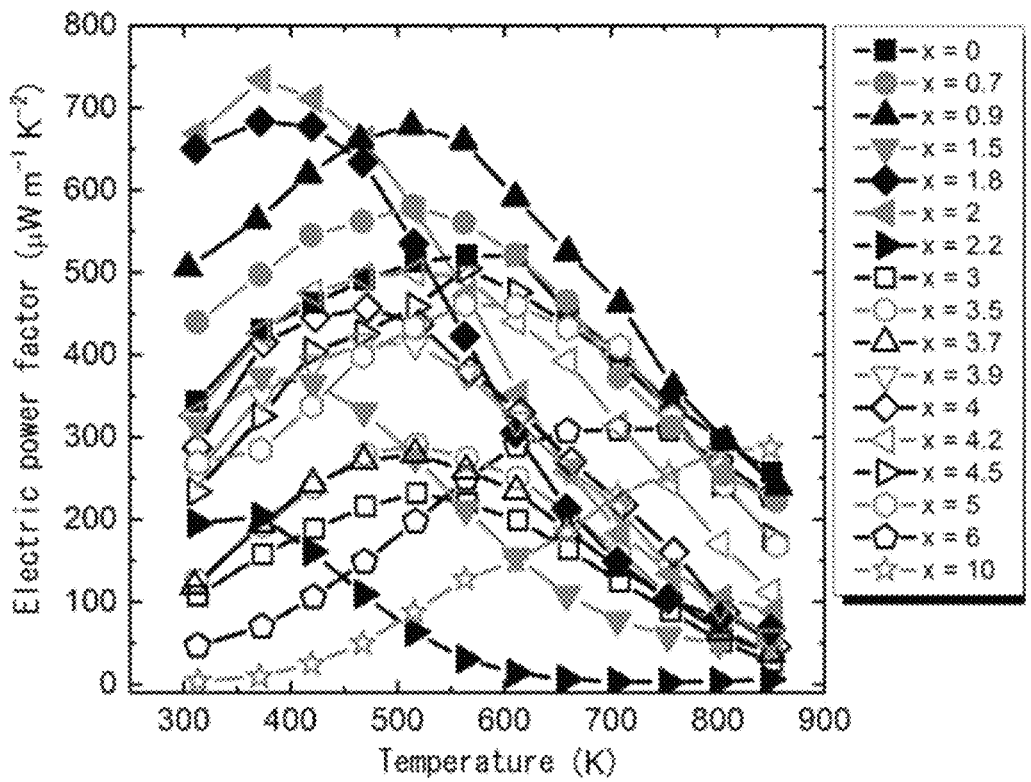
FIG. 8 shows a diagram illustrating temperature dependence of electric power factors of the samples of Examples 2 to 18.

The sintered body was machined (cut) into a rectangular parallelepiped of about 1.5 mm×1.5 mm×9 mm with a high-speed cutting machine, and the electrical conductivity and the thermoelectric property were measured. The electrical conductivity was measured by the direct current four-probe method. The Seebeck coefficient as the thermoelectric property was measured by the steady-state temperature gradient method using a thermoelectric property measurement and evaluation apparatus (ZEM-3, manufactured by ADVANCE RIKO, Inc.). The measurement was performed in a helium gas atmosphere at a temperature ranging from the room temperature to 873 K by the 50 K increments. The electric power factor was calculated from the electrical conductivity and the Seebeck coefficient. These results are shown in FIGS. 6 to 8 and table 5, and will be described later.

The above results will be described.

FIG. 4 shows a diagram illustrating X-ray diffraction patterns of samples according to Comparative Examples 1 and 19, and Example 9.

TABLE 3

Lists of main phases of Examples/Comparative examples 1 to 19

| Examples/Comparative examples | $Al_{23.5+x}Fe_{36.5+y}Si_{40-x-y}$ | | Main phase | Secondary phase |
|---|---|---|---|---|
| | x | y | | |
| Comparative example 1 | −7.25 | 1 | ε-FeSi | $Al_2Fe_3Si_3$ |
| Example 2 | 0 | 0 | $Al_2Fe_3Si_3$ | ε-FeSi |
| Example 3 | 0.7 | 0 | $Al_2Fe_3Si_3$ | ε-FeSi |
| Example 4 | 0.9 | 0 | $Al_2Fe_3Si_3$ | ε-FeSi |
| Example 5 | 1.5 | 0 | $Al_2Fe_3Si_3$ | ε-FeSi |
| Example 6 | 1.8 | 0 | $Al_2Fe_3Si_3$ | ε-FeSi |
| Example 7 | 2 | 0 | $Al_2Fe_3Si_3$ | ε-FeSi |
| Example 8 | 2.2 | 0 | $Al_2Fe_3Si_3$ | ε-FeSi |
| Example 9 | 3 | 0 | $Al_2Fe_3Si_3$ | ε-FeSi |
| Example 10 | 3.5 | 0 | $Al_2Fe_3Si_3$ | ε-FeSi |
| Example 11 | 3.7 | 0 | $Al_2Fe_3Si_3$ | ε-FeSi |
| Example 12 | 3.9 | 0 | $Al_2Fe_3Si_3$ | ε-FeSi |
| Example 13 | 4 | 0 | $Al_2Fe_3Si_3$ | ε-FeSi |
| Example 14 | 4.2 | 0 | $Al_2Fe_3Si_3$ | ε-FeSi |
| Example 15 | 4.5 | 0 | $Al_2Fe_3Si_3$ | ε-FeSi |
| Example 16 | 5 | 0 | $Al_2Fe_3Si_3$ | ε-FeSi |
| Example 18 | 6 | 0 | $Al_2Fe_3Si_3$ | ε-FeSi |
| Example 18 | 10 | 0 | $Al_2Fe_3Si_3$ | ε-FeSi |
| Comparative example 19 | 12 | 0 | ε-FeSi | $Al_2Fe_3Si_3$ |

The X-ray diffraction (XRD) patterns of samples according to Comparative example 1 and Example 9 and Comparative example 19 are shown in (A) to (C) of FIG. 4, respectively. FIG. 4 also shows the X-ray diffraction patterns of $Al_2Fe_3Si_3$ and FeSi obtained from the calculation.

The XRD pattern of FIG. 4(B) was in good agreement with the pattern of $Al_2Fe_3Si_3$ obtained from the calculation. In this way, it was confirmed that the thus-obtained sample had an $Al_2Fe_3Si_3$ phase as a main phase, which accounted for 90 wt % or more. Here, the XRD patterns of the samples of Examples 2 to 8 and Examples 10 to 18, although they are not shown, also showed similar patterns such that it was confirmed that the $Al_2Fe_3Si_3$ phase was the main phase. It was also found that the samples of Examples 2 to 18 included ε-FeSi as the secondary phase in the amount of 1.2 wt % or more and 9.5 wt % or less. For the quantitative measurements of the main phase, the secondary phase, and so on, the ratios of amounts crystallized out were calculated from the ratios of integrated intensities for the strongest peak from the diffraction patterns obtained by the X-ray diffraction measurement. Table 4 summarizes the measurement results.

TABLE 4

Ratios of crystallized ε-FeSi and nominal compositions of Examples/Comparative examples 1 to 19

| Examples/Comparative examples | $Al_{23.5+x}Fe_{36.5+y}Si_{40-x-y}$ | | Ratios of crystallized FeSi (wt %) |
|---|---|---|---|
| | x | y | |
| Comparative example 1 | −7.25 | 1 | Main phase is different |
| Example 2 | 0 | 0 | 3 phases coexist |
| Example 3 | 0.7 | 0 | 3 phases coexist |
| Example 4 | 0.9 | 0 | 3 phases coexist |
| Example 5 | 1.5 | 0 | 3 phases coexist |
| Example 6 | 1.8 | 0 | 8.8 |
| Example 7 | 2 | 0 | 5.8 |
| Example 8 | 2.2 | 0 | 2.4 |
| Example 9 | 3 | 0 | 6.7 |
| Example 10 | 3.3 | 0 | 5.8 |
| Example 11 | 3.7 | 0 | 9.5 |

TABLE 4-continued

Ratios of crystallized ε-FeSi and nominal compositions of Examples/Comparative examples 1 to 19

| Examples/Comparative examples | $Al_{23.5+x}Fe_{36.5+y}Si_{40-x-y}$ | | Ratios of crystallized FeSi (wt %) |
|---|---|---|---|
| | x | y | |
| Example 12 | 3.9 | 0 | 2.3 |
| Example 13 | 4 | 0 | 9.3 |
| Example 14 | 4.2 | 0 | 5.4 |
| Example 15 | 4.5 | 0 | 4.6 |
| Example 16 | 5 | 0 | 5.6 |
| Example 18 | 6 | 0 | 6.5 |
| Example 18 | 10 | 0 | 5.4 |
| Comparative example 19 | 12 | 0 | Main phase is different |

On the other hand, in the XRD pattern of FIG. 4(A), a peak corresponding to $Al_2Fe_3Si_3$ was partially observed, but ε-FeSi was the main phase. From this result, the sample of Comparative example 1 did not have the $Al_2Fe_3Si_3$ phase as the main phase. Similarly, the XRD pattern of FIG. 4(C) shows a peak corresponding to ε-FeSi, and the sample of Comparative example 19 did not have the $Al_2Fe_3Si_3$ phase as the main phase. As mentioned above, it was shown that the adjustment of raw materials was preferably made to satisfy a general formula of $Al_{23.5+x}Fe_{36.5+y}Si_{40-x-y}$ (Here, x and y satisfied $-7.25<x<12$ and $-0.5 \leq y \leq 1.5$, respectively.) when manufacturing a thermoelectric material according to the present invention.

Table 5 summarizes the lattice constants and unit cell volumes of the $Al_2Fe_3Si_3$ phase samples. As can be seen from this table, as the x increases, the lattice constant a tends to increase, the lattice constants b and c tend to decrease, and the volume V tends to increase.

TABLE 5

Lattice constants and unit cell volumes and nominal compositions of Examples/Compartive examples 1 to 19

| Examples/Comparative examples | $Al_{23.5+x}Fe_{36.5+y}Si_{40-x-y}$ | | a (Å) | b (Å) | c (Å) | α (degree) | β (degree) | γ (degree) | V (Å³) |
|---|---|---|---|---|---|---|---|---|---|
| | x | y | | | | | | | |
| Compatative example 1 | -7.25 | 1 | — | — | — | — | — | — | — |
| Example 2 | 0 | 0 | 4.5995 | 6.3352 | 7.521 | 101.827 | 106.427 | 100.729 | 198.67 |
| Example 3 | 0.7 | 0 | 4.5974 | 6.3322 | 7.5164 | 101.844 | 106.389 | 100.728 | 198.38 |
| Example 4 | 0.9 | 0 | 4.6046 | 5.3376 | 7.5222 | 101.828 | 106.411 | 106.741 | 199 |
| Example 5 | 1.5 | 0 | 4.6075 | 6.3314 | 7.5145 | 101.758 | 106.352 | 100.737 | 196.88 |
| Example 6 | 1.8 | 0 | 4.6061 | 6.3311 | 7.5119 | 101.762 | 106.395 | 100.758 | 198.71 |
| Example 7 | 2 | 0 | 4.6048 | 5.3319 | 7.5135 | 101.769 | 106.361 | 100.75 | 198.72 |
| Example 8 | 2.2 | 0 | 4.609 | 6.3298 | 7.5077 | 101.711 | 106.325 | 100.773 | 198.77 |
| Example 9 | 3 | 0 | 4.6161 | 6.3268 | 7.5065 | 101.659 | 106.246 | 100.827 | 199.05 |
| Example 10 | 3.5 | 0 | 4.5156 | 6.3279 | 7.5067 | 101.662 | 106.274 | 100.825 | 199.07 |
| Example 11 | 3.7 | 0 | 4.6169 | 6.3306 | 7.511 | 101.696 | 106.297 | 100.77 | 199.27 |
| Example 12 | 3.9 | 0 | 4.6173 | 6.3257 | 7.5079 | 101.556 | 105.25 | 100.82 | 199.11 |
| Example 13 | 4 | 0 | 4.5172 | 5.3276 | 7.5068 | 101.659 | 106.27 | 100.813 | 199.11 |
| Example 14 | 4.2 | 0 | 4.8273 | 6.3283 | 7.508 | 101.581 | 106.181 | 100.921 | 199.7 |
| Example 15 | 4.5 | 0 | 4.309 | 6.3265 | 7.5075 | 101.489 | 106.163 | 100.968 | 199.82 |
| Example 16 | 5 | 0 | 4.633 | 6.3335 | 7.5085 | 101.529 | 106.244 | 100.966 | 200.04 |
| Example 18 | 6 | 0 | 4.5406 | 6.3159 | 7.4957 | 101.345 | 105.992 | 101.167 | 199.78 |
| Example 18 | 10 | 0 | 4.6772 | 6.3223 | 7.4567 | 101.011 | 105.698 | 101.573 | 201.88 |
| Camparative example 19 | 12 | 0 | — | — | — | — | — | — | — |

Further, Table 6 shows the results of composition analysis by the X-ray fluorescence analysis.

TABLE 6

Lists of compositions of Examples 2, 6, 8, 9, and 18

| Examples | $Al_{23.5+x}Fe_{36.5+y}Si_{40-x-y}$ | | $Al_{12+p}Fe_{38.5\pm1.0}Si_{49.5-p}$ |
|---|---|---|---|
| | x | y | p |
| Example 2 | 0 | 0 | 7.9 |
| Example 6 | 1.8 | 0 | 8.3 |
| Example 8 | 2.2 | 0 | 8.8 |
| Example 9 | 3 | 0 | 10 |
| Example 18 | 10 | 0 | 16.5 |

From Table 6, the sample obtained in Example 6 was $Al_{20.3}Fe_{38.5}Si_{41.2}$, the sample obtained in Example 9 was $Al_{22}Fe_{38.5}Si_{39.5}$, and the sample obtained in Example 18 was $Al_{28.5}Fe_{38.5}Si_{33}$. Although not shown in the table, the samples of Examples 5 and 7 were in a range of $Al_{12+p-q}Fe_{38.5+3q}Si_{49.5-p-2q}$ (Here, p satisfied $0 \leq p < 10$ and q satisfied −0.34≤q≤0.34.) and the samples of Examples 10 to 15 and 17 were in a range of $Al_{12+p-q}Fe_{38.5+3q}Si_{49.5-p-2q}$ (Here, p satisfied 10≤p≤16.5 and q satisfied −0.34≤q≤0.34.). And only the case where y=0 is handled here, but the value of y may be in a range of −0.5≤y≤1.5 (for example, −0.5, −0.2, 0.1, 0.3, 0.5, 0.7, 0.9, 1.0, 1.2, and 1.5) and when the value of y changes, in particular, the atomic percentage (at %) of Fe (and at % of Si) is likely to change. In an approximate manner, it is also considered that $Al_{12+p}Fe_{37.5}Si_{49.5-p}$ changes to $Al_{12+p}Fe_{39.5}Si_{49.5-p}$.

Figure 1E:
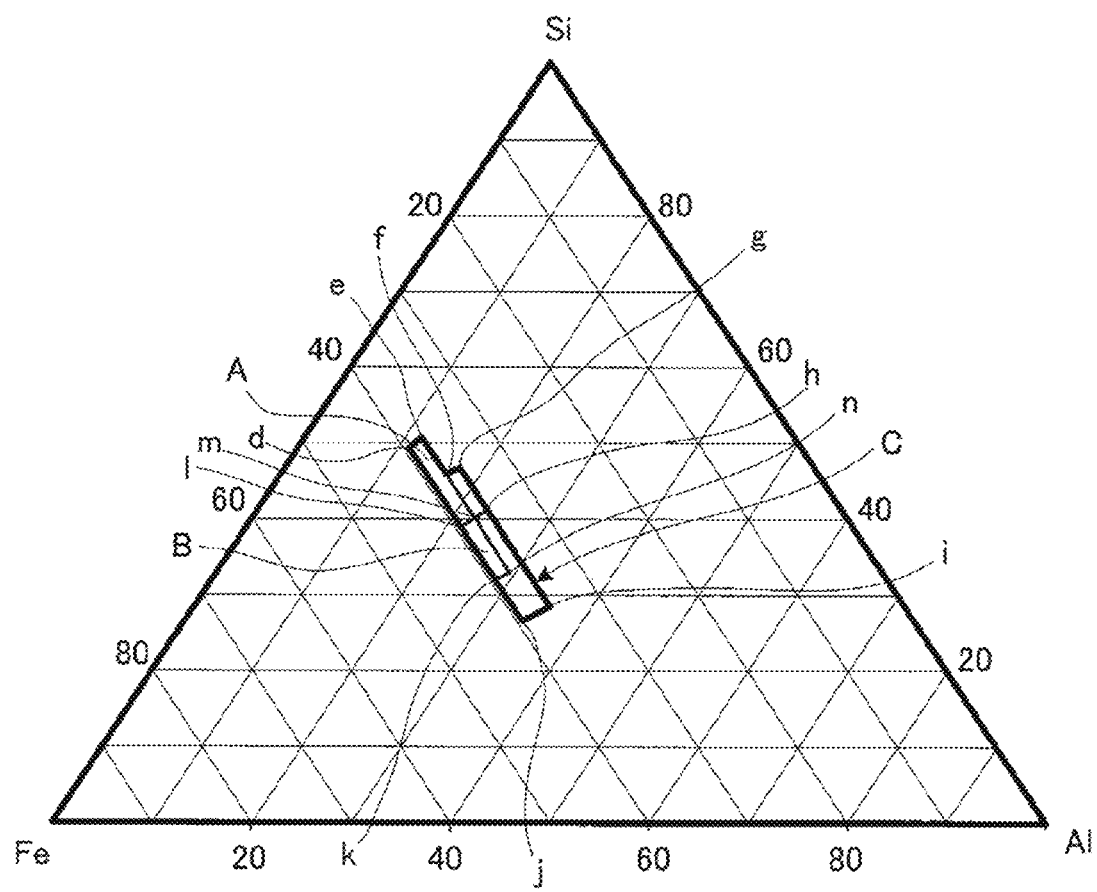
FIG. 1E shows a diagram illustrating an Al—Fe—Si ternary phase diagram schematically showing each vertex and each region of a polygon composed of line segments based on dots plotted in FIG. 1B.

As mentioned above, if a method according to the present invention is carried out, it is shown that a material including at least Al, Fe, and Si; having a phase represented by $Al_2Fe_3Si_3$ as a main phase; and having an intermetallic compound as a main component, which is represented by a general formula of $Al_{12+p-q}Fe_{38.5+3q}Si_{49.5-p-2q}$ (Here, p satisfies 0≤p≤16.5 and q satisfies −0.34≤q≤0.34.), can be obtained. Here, FIG. 1E illustrates a region surrounded by the line having an $Al_2Fe_3Si_3$ phase as a main phase from the plotted dots in FIG. 1B. For example, four vertices d, e, n, and k defining a gray zone in FIG. 1B may be represented by as follows:

d: $Al_{11.2}Fe_{39.5}Si_{49.3}$;
e: $Al_{11.8}Fe_{37.5}Si_{50.7}$;
n: $Al_{29.6}Fe_{37.5}Si_{32.9}$; and
k: $Al_{28.5}Fe_{39.5}Si_{32.0}$.

And in the nominal compositions in FIG. 1B, the points i and j on the Al-rich side that define the boundary of the region where the $Al_2Fe_3Si_3$ phase is the main phase may be represented by as follows:

i: $Al_{35.8}Fe_{35.7}Si_{28.5}$; and
j: $Al_{34.0}Fe_{39.5}Si_{26.5}$.

Further, the point g that defines the boundary line on the Fe lean side together with the point i may be represented by as follows:

g: $Al_{17.6}Fe_{35.7}Si_{46.7}$.

The boundary of the Si-rich region on the Fe lean side, which is not necessarily clear because no experimental data is presented, can be represented by a line segment formed by connecting the points g and f, even if only a certain region is defined:

f: $Al_{16.7}Fe_{37.5}Si_{45.8}$.

And the upper limit of Si is defined by the points d and e in combination with the data based on the composition of the sintered body made of the melted and reacted material on the Fe-rich side. Although details will be described later, it has been found that in a composition represented by $Al_{12+p-q}Fe_{38.5+3q}Si_{49.5-p-2q}$ (in particular, the melted and reacted material composition), under the condition of 0≤p<10, an n-type thermoelectric material can be obtained while, under the condition of 10≤p≤16.5, a p-type thermoelectric material can be obtained. Since the same can apply under the condition that q satisfies −0.34≤q≤0.34, a thermoelectric material having specific properties can be obtained in such a range of composition (in particular, the melted and reacted material composition). It is considered that the present unique characteristics may appear by the process of melting and causing mutual reactions under the predetermined condition as described in the present specification. Therefore, even if it is a mere mixed composition in which the apparent components match mutually, the product does not correspond to that of the melted and reacted material according to the present disclosure unless it is melted and reacted in such a manner. In addition, with respect to the specific crystal phase, it is preferably in the region in which the $Al_2Fe_3Si_3$ phase is the main phase. It is also considered that such a boundary for distinguishing between the n-type and the p-type corresponds to a line connecting the points 1 and h (and the intermediate point m).

l: $Al_{22.7}Fe_{39.5}Si_{38.8}$;
h: $Al_{22.9}Fe_{35.7}Si_{42.3}$; and
m: $Al_{22.3}Fe_{37.5}Si_{40.2}$.

It is considered that the above compositional features are important in a melted and reacted material serving as a raw material of a sintered body. For example, it is considered that an n-type thermoelectric material can be obtained in the region A of FIG. 1E and a p-type thermoelectric material can be obtained in the region B. Furthermore, it can be said that it is possible that an n-type or a p-type thermoelectric material can be obtained even in the region C defined by the thick frame including the mixed composition before being melted and reacted. That is, since the manufacturing technology is developed and diversified, the composition may not change or hardly change before and after being melted and reacted such that an intermetallic compound of any composition in the whole region of the region C may become an n-type or a p-type thermoelectric material to be useful in such a case.

Since the samples of Comparative examples 1 and 19 did not have the $Al_2Fe_3Si_3$ phase as the main phase, no sintered body was manufactured, and the electrical conductivities and thermoelectric properties were not measured.

FIG. 5 shows a diagram showing an outer appearance of a sample of Example 18.

According to FIG. 5, it was found that a uniform and good sintered body as a whole could be obtained. Although not shown here, the sintered bodies of Examples 2 to 17 appeared similarly.

FIG. 6 shows a diagram illustrating the temperature dependence of electrical conductivities of samples of Examples 2 to 18.

According to FIG. 6, it was found that every sample had an electrical conductivity usable as a thermoelectric material and exhibited a temperature dependency thereof in the measurement temperature range. And if the electrical conductivity at the room temperature is focused on, the electrical conductivity can be changed from 250 $(\Omega cm)^{-1}$ to 2500 $(\Omega cm)^{-1}$ by controlling the composition. When fabricating the thermoelectric conversion module, a material having an electrical conductivity required in an operating temperature range may be selected as appropriate. Although the samples of Examples 6 and 7 showed particularly high electrical conductivities, the samples of Examples 6 and 7 included 8.8 wt % and 5.8 wt % of ε-FeSi phases, respectively, as the secondary phase, which might have caused the electrical conductivity to be enhanced.

FIG. 7 shows a diagram illustrating a temperature dependence of Seebeck coefficients of samples of Examples 2 to 18.

From FIG. 7, in the measurement temperature range (from the room temperature to 600° C.), it was confirmed that the samples of Examples 2 to 8 showed negative Seebeck coefficients and had n-type conduction while the samples of Examples 9 to 18 showed positive Seebeck coefficients and had p-type conduction. That is, it is represented by the general formula of $Al_{12+p-q}Fe_{38.5+3q}Si_{49.5-p-2q}$ (p satisfies 0≤p<10 and q satisfies −0.34≤q≤0.34) and an intermetallic compound having the $Al_2Fe_3Si_3$ phase as a main phase works as an n-type thermoelectric material while it is represented by the general formula of $Al_{12+p-q}Fe_{38.5+3q}Si_{49.5-p-2q}$ (p satisfies 10≤p≤16.5 and q satisfies −0.34≤q≤0.34) and an intermetallic compound having the $Al_2Fe_3Si_3$ phase as a main phase works as a p-type thermoelectric material.

In particular, if the temperature range from the room temperature to 200° C. or lower is focused on, it was found that the parameter p satisfied 8≤p≤9 such that it became an n-type thermoelectric material exhibiting a larger Seebeck coefficient (absolute value) while the parameter p satisfied 11≤p≤12 such that it became a p-type thermoelectric material exhibiting a larger Seebeck coefficient.

FIG. 8 shows a diagram illustrating a temperature dependence of electric power factors of samples of Examples 2 to 18.

From FIG. 8, it was found that a high electric power factor could be achieved in a measurement temperature range by selecting the composition. For example, the samples of Examples 6 and 7 exhibit high electric power factors in a temperature range from the room temperature to 600 K or lower, and, in particular, it can be said to be suitable for recovering poor heat corresponding to a temperature of 200° C. or lower such that a thermoelectric power generation module for the practical use can be provided. The samples of Examples 3 and 4 were found to be n-type thermoelectric materials exhibiting high electric power factors having peaks at 500 K in a temperature range from the room temperature to 700 K.

The above results are summarized in Table 7 for simplicity. As can be seen from this table, by increasing the value of x (by replacing Si with Al), an effect similar to that of hole doping is obtained so as to change from the n-type to the p-type. Therefore, the conduction type can be controlled without performing chemical doping using another kind of element.

TABLE 7

Lists of thermoelectric properties (@ room temperature) of Examples/Comparative examples 1 to 19

| Examples/Comparative examples | $Al_{23.5+x}Fe_{36.5+y}Si_{40-x-y}$ | | Electrical conductivity | Seebeck coefficient | Conduction type |
|---|---|---|---|---|---|
| | x | y | $(\Omega^{-1}cm^{-1})$ | $(\mu VK^{-1})$ | |
| Comparative example 1 | −7.25 | 1 | — | — | — |
| Example 2 | 0 | 0 | 1074 | −57 | n |
| Example 3 | 0.7 | 0 | 861 | −71 | n |
| Example 4 | 0.9 | 0 | 824 | −78 | n |
| Example 5 | 1.5 | 0 | 430 | −86 | n |
| Example 6 | 1.8 | 0 | 462 | −119 | n |
| Example 7 | 2 | 0 | 545 | −111 | n |
| Example 8 | 2.2 | 0 | 236 | −91 | n |
| Example 9 | 3 | 0 | 291 | 61 | p |
| Example 10 | 3.5 | 0 | 261 | 70 | p |
| Example 11 | 3.7 | 0 | 224 | 73 | p |
| Example 12 | 3.9 | 0 | 365 | 84 | p |
| Example 13 | 4 | 0 | 381 | 87 | p |
| Example 14 | 4.2 | 0 | 1054 | 56 | p |
| Example 15 | 4.5 | 0 | 1649 | 38 | p |
| Example 16 | 5 | 0 | 1754 | 39 | p |
| Example 18 | 6 | 0 | 2354 | 14 | p |
| Example 18 | 10 | 0 | 2990 | 4 | p |
| Comparative example 19 | 12 | 0 | — | — | — |

In addition, the following can also be provided.

(1) A thermoelectric material to be used for a device that converts between heat and electric power, comprising:
an intermetallic compound including least Al, Fe, and Si;
a composition represented by a general formula of $Al_{12+p}Fe_{38.5\pm1.0}Si_{49.5-p}$ (where p satisfies 0≤p≤16.5); and
a crystal phase represented by $Al_2Fe_3Si_3$.

(2) The thermoelectric material according to the above (1), wherein p satisfies 0≤p<10.
(3) The thermoelectric material according to the above (1), wherein p satisfies 10≤p≤16.5.
(4) The thermoelectric material according to any one of the above (1) to (3), wherein the thermoelectric material includes 70 wt % or more of a crystal phase represented by $Al_2Fe_3Si_3$.
(5) The thermoelectric material according to any one of the above (1) to (4), further comprising a crystal phase represented by ε-FeSi.
(6) An n-type thermoelectric element comprising the material of the above (2).
(7) A p-type thermoelectric element comprising the material of the above (3).
(8) A thermoelectric power generation module comprising an n-type thermoelectric element of the above (6) and/or a p-type thermoelectric element of the above (7).
(9) A method of manufacturing by switching between an n-type thermoelectric material for an n-type thermoelectric element and a p-type thermoelectric material for a p-type thermoelectric element, comprising the steps of:
weighing a raw material including Al, a raw material including Fe, and a raw material including Si such that a molar ratio of Al:Fe:Si=23.5+x:36.5+y:40−x−y (where −7.25<x<12 and −0.5≤y≤1.5 are satisfied);
obtaining a mixed powder by mixing the thus-weighed respective raw materials; and
melting the mixed powder and causing mutual reaction,
wherein the step of weighing comprises increasing an amount of x so as to change from the n-type thermoelectric material to the p-type thermoelectric material or decreasing the amount of x so as to change from the p-type thermoelectric material to the n-type thermoelectric material such that thermoelectric materials for manufacturing are switched.

INDUSTRIAL APPLICABILITY

Since a thermoelectric material according to the present invention exhibits n-type and p-type thermoelectric characteristics in a temperature range of 600° C. or lower only by controlling a composition thereof such that a high electric power factor can be achieved, it can be utilized in a power-generating unit to be used by various kinds of electric equipments. In particular, if a thermoelectric material is formed into a thin film, a flexible thermoelectric power generation module including the thin film can be provided as an IoT power supply.

Explanation of Numerals

300 thermoelectric power generation module
310 n-type thermoelectric material
320 p-type thermoelectric material
330, 340 electrode

What is claimed is:

1. A thermoelectric material comprising an intermetallic compound comprising at least Al, Fe, and Si,
wherein the intermetallic compound is represented by a general formula of $Al_{12+p-q}Fe_{38.5+3q}Si_{49.5-p-2q}$ (where p satisfies 0≤p≤16.5 and q satisfies −0.34≤q≤0.34) and the intermetallic compound comprises a phase represented by $Al_2Fe_3Si_3$ as a main phase and a phase represented by ε-FeSi.

2. The thermoelectric material according to claim 1, wherein p satisfies 0≤p≤10 and an n-type is exhibited in a temperature range from a room temperature to not exceeding 600° C.

3. The thermoelectric material according to claim 2, wherein p satisfies 8≤p≤9 and the n-type is exhibited in a temperature range from the room temperature to not exceeding 600° C.

4. The thermoelectric material according to claim 1, wherein p satisfies 10≤p≤16.5 and a p-type is exhibited in a temperature range from a room temperature to not exceeding 600° C.

5. The thermoelectric material according to claim 4, wherein p satisfies 11≤p≤12 and a p-type is exhibited in a temperature range from a room temperature to not exceeding 600° C.

6. The thermoelectric material according to claim 1, wherein the intermetallic compound comprises at least 70 wt % of the phase represented by $Al_2Fe_3Si_3$.

7. The thermoelectric material according to claim 1, wherein the intermetallic compound comprises a phase represented by ε-FeSi in a range of at least 0.5 wt % and less than 10 wt %.

8. A method of manufacturing a thermoelectric material, comprising the steps of:
mixing a raw material comprising Al, a raw material comprising Fe, and a raw material comprising Si such that a general formula of $Al_{23.5+x}Fe_{36.5+y}Si_{40-x-y}$ (where x and y satisfy −7.25≤x≤12 and −0.5≤y≤1.5, respectively) is satisfied; and
melting a mixture obtained in the mixing step and causing a reaction to produce the thermoelectric material that comprises an intermetallic compound represented by a general formula of $Al_{12+p-q}Fe_{38.5+3q}Si_{49.5-p-2q}$ (where p satisfies 0≤p≤16.5 and q satisfies −0.34≤q≤0.34) and comprising a phase represented by $Al_2Fe_3Si_3$ as a main phase and a phase represented by ε-FeSi.

9. The method according to claim 8, wherein x satisfies −7.25≤x≤3 in the mixing step.

10. The method according to claim 9, wherein x satisfies 1.5≤x≤2.5 in the mixing step.

11. The method according to claim 8, wherein x satisfies 3≤x≤12 in the mixing step.

12. The method according to claim 11, wherein x satisfies 3.5≤x≤4 in the mixing step.

13. The method according to claim 8, wherein the mixture is heated in an inert atmosphere in a temperature range of at least 1500° C. and not exceeding 2200° C. in the step of melting and causing the reaction.

14. The method according to claim 8, further comprising the step of sintering a reaction product obtained in the step of melting and causing the reaction.

15. The method according to claim 14, wherein the sintering step comprises the step of pulverizing the reaction product and pulse electric sintering the reaction product.

16. The method according to claim 14, wherein the step of sintering is performed in a pressure range of at least 10 MPa and not exceeding 200 MPa in a temperature range of at least 800° C. and not exceeding 1000° C.

17. The method according to claim 14, further comprising the step of molding a sintered body obtained in the step of sintering.

18. A thermoelectric power generation module comprising an n-type thermoelectric material and a p-type thermoelectric material alternately connected in series,
wherein at least one of the n-type thermoelectric material and the p-type thermoelectric material is a thermoelectric material comprising: an intermetallic compound represented by a general formula of $Al_{12+p-q}Fe_{38.5+3q}Si_{49.5-p-2q}$ (where p satisfies 0≤p≤16.5 and q satisfies −0.34≤q≤0.34) and the intermetallic compound comprises a phase represented by $Al_2Fe_3Si_3$ as a main phase and a phase represented by ε-FeSi.

19. The thermoelectric power generation module according to claim 18,
wherein the n-type thermoelectric material is represented by a general formula of $Al_{12+p-q}Fe_{38.5+3q}Si_{49.5-p-2q}$ (where p satisfies 0≤p≤10 and q satisfies −0.34≤q≤0.34),
wherein the p-type thermoelectric material is represented by a general formula of $Al_{12+p-q}Fe_{38.5+3q}Si_{49.5-p-2q}$ (where p satisfies 10≤p≤16.5 and q satisfies −0.34≤q≤0.34).

* * * * *